(12) United States Patent
Chang et al.

(10) Patent No.: US 7,015,571 B2
(45) Date of Patent: Mar. 21, 2006

(54) MULTI-CHIPS MODULE ASSEMBLY PACKAGE

(75) Inventors: Chih-Huang Chang, Yungkang (TW); Shih-Chang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 40 days.

(21) Appl. No.: 10/704,793

(22) Filed: Nov. 12, 2003

(65) Prior Publication Data

US 2005/0098868 A1    May 12, 2005

(51) Int. Cl.
*H01L 23/02* (2006.01)
*H01L 23/48* (2006.01)
*H01L 23/52* (2006.01)
*H01L 29/40* (2006.01)

(52) U.S. Cl. .................... 257/686; 257/779; 257/786; 174/266

(58) Field of Classification Search .................... None
See application file for complete search history.

(56) References Cited

*Primary Examiner*—David A. Zarneke
(74) *Attorney, Agent, or Firm*—Bacon & Thomas, PLLC

(57) ABSTRACT

A multi-chips module assembly package mainly comprises a first package, a second package and an intermediate substrate. The intermediate substrate includes an opening, at least a via and a plurality of circuit layers, wherein the second package is accommodated in the opening. The via has an inner wall, and a plurality of separated electrically conductive layers, which is formed on the inner wall and connected with the corresponding circuit layers. The first package electrically connects with the second package through the intermediate substrate, and the intermediate substrate is interposed between the first package and the second package. At least an insulator is formed in the via, and the separated electrically conductive layers are separated from each other. After the intermediate substrate is interposed between the first package and the second package, there will be not enough space between the intermediate substrate, the first package and the second package for disposing conductive devices therein. Therefore, the first package will be electrically connected to the second package through the separated electrically conductive layers of the intermediate substrate for providing more conductive devices disposed and interposed between the intermediate substrate, the first package and the second package.

21 Claims, 6 Drawing Sheets

MULTI-CHIPS MODULE ASSEMBLY PACKAGE

BACKGROUND OF THE INVENTION

1. Field of Invention

This invention relates to a multi-chips module assembly package. More particularly, the present invention is related to a multi-chips module assembly package having an intermediate substrate with a via, wherein the via has a plurality of electrically conductive layers formed therein and electrically isolated from each other.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multi-chips module) package is commonly used in said assembly package and electronic devices. Usually, said MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, as shown in FIG. 1, it illustrates the cross-sectional view of a conventional assembly package in a side-by-side type. Two assembly packages 11 and 12 are disposed on a carrier 13, for example an organic substrate, in parallel, and electrically connected to an outer device through conductive devices 14, for example, solder balls. Moreover, said multi-chips module assembly package (MCM assembly package) can be an assembly package in a stacked type as shown in FIG. 2 or an assembly package with an intermediate substrate 20 therein as shown in FIG. 3.

As shown in FIG. 2, a first assembly package 21 comprises a first substrate 211 and a first chip 212, wherein the first chip 212 is flip-chip bonded to and electrically connected to the first substrate 211; and a second assembly package 22 comprises a second substrate 221 and a second chip 222 which is flip-chip bonded to and electrically connected to the second substrate 221. Therein, the first package 21 and the second package 22 can also be wire-bond packages. In addition, the first package 21 further comprises a first conductive device 213, for example a solder ball, mounted on the lower surface of the first substrate 221 to electrically connect to the second package 22 through the second substrate 221. Similarly, said second package 22 further comprises a second conductive device 223 formed on the lower surface of the second substrate 221 to transmit the signals from the first package 21 and the second package 22 to an external device. The second chip 222 is disposed below the lower surface of the first substrate 211, so there is not enough space to dispose the first conductive devices 213 on the lower surface of the first substrate 211. Accordingly, the number of the first conductive devices 213 will be reduced.

Next, referring to FIG. 3 and FIG. 4, which illustrate another stacked-type assembly packages. It should be noted that the reference numeral of each element in FIGS. 3 and 4 corresponds to the same reference numeral of each element in FIG. 2. There is an opening 206 formed in an intermediate substrate 20; the second chip 222 of the second package 22 is disposed in the opening 206 and electrically connected to the first package 21. Therein, the first package 21 comprises a first conductive device 213, for example a solder ball, formed on the lower surface of the first substrate 211 to electrically connect to the intermediate substrate 20, and the lower surface of the intermediate substrate 20 has a third conductive device 23 formed thereon to electrically connect to the second package 22. In addition, said second package 22 further comprises a second conductive device 223 formed on the lower surface of the second substrate 221 to transmit the signals from the first package 21 and the second package 22 to an external device through the intermediate substrate 20.

As shown in FIG. 5, the intermediate substrate 20 mainly includes a board 200. The board 200 comprises a core board 201, a plurality of insulating layers 202 and circuit layers 203. The insulating layers 202 and the circuit layers 203 are interlaced with each other. The circuit layers 203 are electrically connected with each other through vias 204 such as through holes, buried vias or blind vias. Now taken a through hole for example, initially, the insulating layers 202 and the circuit layers 203, which are interlaced with each other, are penetrated to form a through hole therein by the method of mechanical drilling or laser ablation. Next, the inner wall of the through hole is electro-less plated with a copper film and then another copper layer is deposited on the copper film. Finally, the through hole is filled with an insulating material or an insulator, for example epoxy and ink. Now referring to FIG. 6, via land 205 is disposed at the periphery of the via 204 to electrically connect the circuit traces 203 and the via 204. Generally speaking, if the diameter of the via 204 is about 300 $\mu$m, the diameter of the via land 205 will be about 500 $\mu$m. In addition, a landless design can be employed to save the area for the arrangement of the via land 205. However, the process of the landless design is complex and the cost is increased.

As shown in FIG. 6, the via lands 205 occupy a lot of areas so that the areas for laying out the circuit traces are reduced. In such a manner, the circuit traces 203 will be finer and the pitches between the circuit traces 203 will be fined down. Consequently, it will be difficult to fabricate this kind of intermediate substrate. Besides, the quality of the electricity will be seriously affected in that, with reference to FIG. 6, the bent portions of the conductive traces and the distance of the signal transmission are increased.

Moreover, referring to FIG. 3, said intermediate substrate 20 is provided to define a space so as to prevent the second chip 222 of the second package 22 from interfering the first substrate 211 being disposed above said second chip 222. However, the first conductive device 213 can only be disposed at the periphery of the lower surface of the first substrate 211, so the number of the first conductive devices to be mounted on the first substrate 211 is decreased. If the number of the vias 204 is increased by utilizing plasma, Nd:YAG laser and excimer laser to reduce the size of the via 204, the areas for laying out the circuit traces 203a can be increased to reduce the bent portions of the circuit traces 203a. However, the fabrication method of plating metal layer on the inner wall of the via 240 will become more complex due to the smaller diameter of the via 240. In addition, the via lands 205 occupy a great portion of the circuit layers 204, so the bent portions of the circuit traces 203a are increased and the distance for transmitting signals are extended.

Therefore, providing another assembly package to solve the mentioned-above disadvantages is the most important task in this invention.

SUMMARY OF THE INVENTION

In view of the above-mentioned problems, an objective of this invention is to provide a multi-chips module assembly package with a first package, a second package and an intermediate substrate. Therein, the intermediate substrate is disposed and interposed between the first package and the second package, and is electrically connected the first package to the second package; and the intermediate substrate has at least one via and a plurality of circuit layers. It should be noted that at least one insulator or insulating material is formed in the via so as to separate the electrically conductive layer into separated electrically conductive layers to be electrically isolated the separated electrically conductive layers, formed on the inner wall of the via, from each other. Thus, the separated electrically conductive layers are electrically connected to the corresponding circuit layers respectively.

As mentioned above, the via of the intermediate substrate has a plurality of separated electrically conductive layers formed therein and said conductive layers are electrically isolated from each other, so the number of the conductive devices electrically connecting to the conductive layers for transmitting the signals to external devices will be increased.

To achieve the above-mentioned objective, a multi-chips module assembly package is provided, wherein the multi-chips module assembly package comprises a first package, an intermediate substrate, a second package. Therein, the second package is electrically connected to the first package through the intermediate substrate. It should be noted that the intermediate substrate has at least one via and a plurality of circuit layers, and the via has an inner wall with a plurality of separated electrically conductive layers formed thereon and electrically connected to the corresponding circuit layers respectively. Moreover, at least one insulator is formed in the via so as to cause the conductive layers to be electrically isolated from each other.

According to this invention, the intermediate substrate has at least one via with a plurality of separated electrically conductive layers formed therein and said conductive layers are electrically isolated from each other, so there are more spaces to provide more electrical paths for transmitting signals from first package and second package to external devices.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
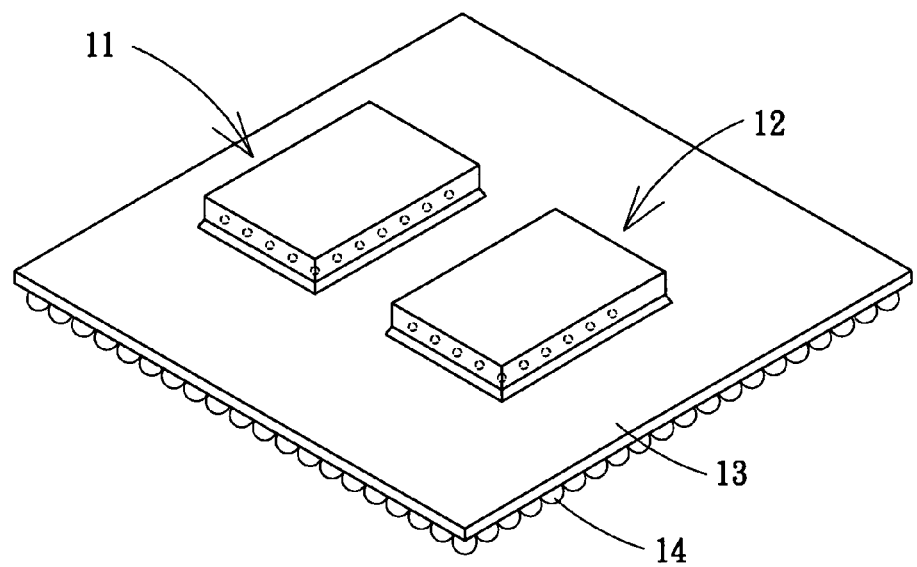
FIG. 1 is a top view of the conventional multi-chips module assembly package in a side-by-side type.
Figure 2:
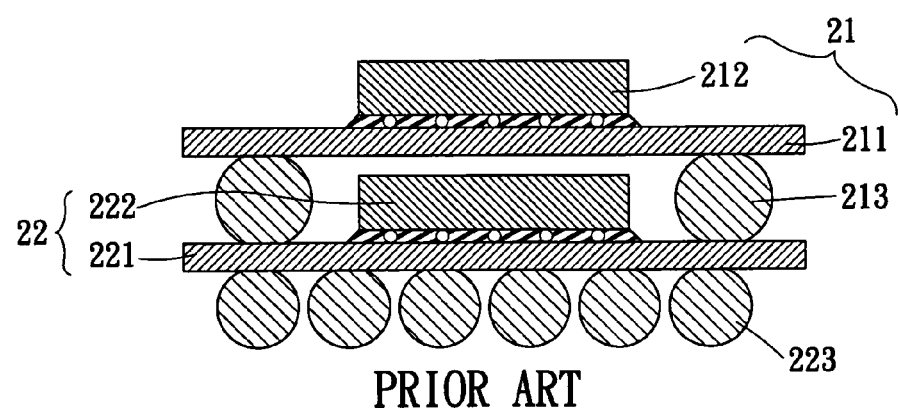
FIG. 2 is a cross-sectional view of another conventional multi-chips module assembly package in a stacked type.
Figure 3:
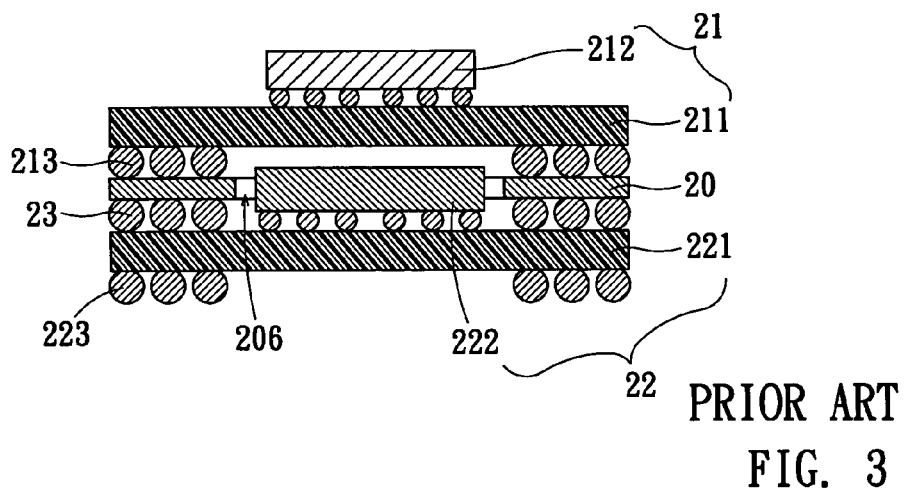
FIG. 3 is a cross-sectional view of another conventional multi-chips module assembly package with an intermediate substrate in a stacked type.
Figure 4:
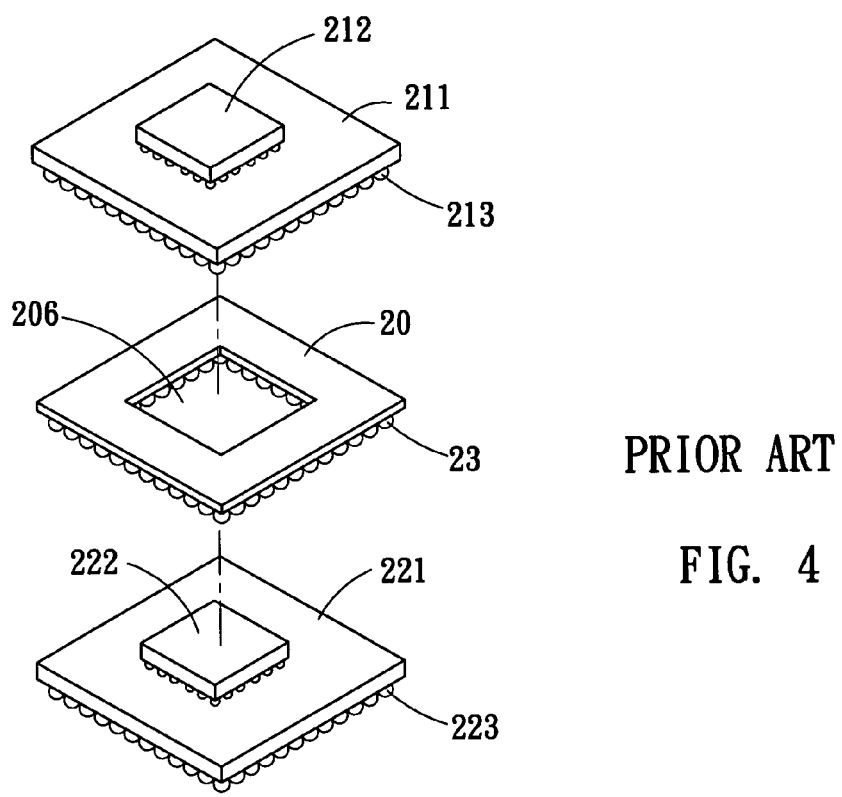
FIG. 4 is an exploded view of said conventional multi-chips module assembly package according to FIG. 3.

The multi-chips module assembly package according to the preferred embodiment of this invention will be described herein below with reference to the accompanying drawings, wherein the same reference numbers refer to the same elements.

In accordance with a first preferred embodiment as shown from FIG. 7 to FIG. 10, there is provided a multi-chips module assembly package. The multi-chips module assembly package mainly comprises an intermediate substrate 30, a first package 31 and a second package 32. The first package 31 at least comprises a first substrate 311 and a first chip 312, wherein the first chip 312 is electrically connected to the first substrate 311 by flip-chip bonding. Similarly, The second package 32 at least comprises a second substrate 321 and a second chip 322, wherein the second chip 322 is electrically connected to the second substrate 321 by flip-chip bonding, and disposed in the opening 308 of the intermediate substrate 30. Thus, the second package 32 is connected to the first package 31 through the intermediate substrate 30. In addition, the first package 31 and the second package 32 can be wire-bond packages. Namely, the first chip 312 and the second chip 322 can be electrically connected to the first substrate 311 and the second substrate 321 respectively by wire-bonding technology. Therein, the first package 31 further comprises a first conductive device 313, for example a solder ball, formed on the lower surface of the first substrate 311 for electrically connecting to the intermediate substrate 30; the intermediate substrate 30 further has a third conductive device 33 formed on the lower surface of the intermediate substrate 30 for electrically connecting to the second package 32; and the second package 32 also has a second conductive device 32 formed on the lower surface of the second substrate 321 for electrically connecting to an external device, for example a mother board. Accordingly, the signals can be transmitted from the first package 31 and the second package 32 to said external devices through the intermediate substrate 30.

Figure 5:
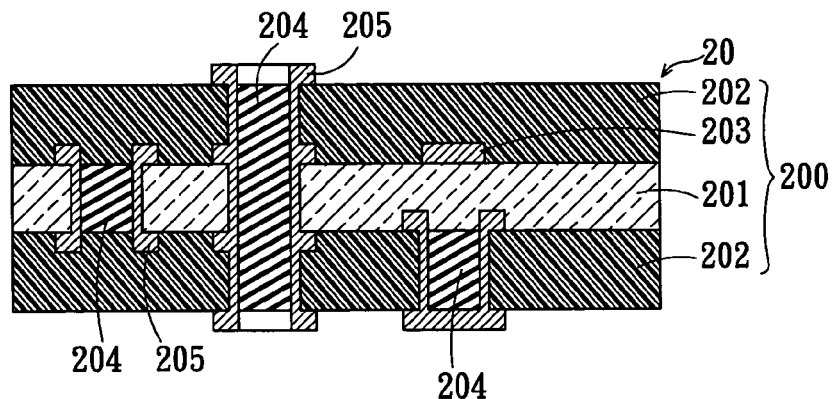
FIG. 5 is a cross-sectional view of an intermediate substrate according to FIG. 3.
Figure 6:
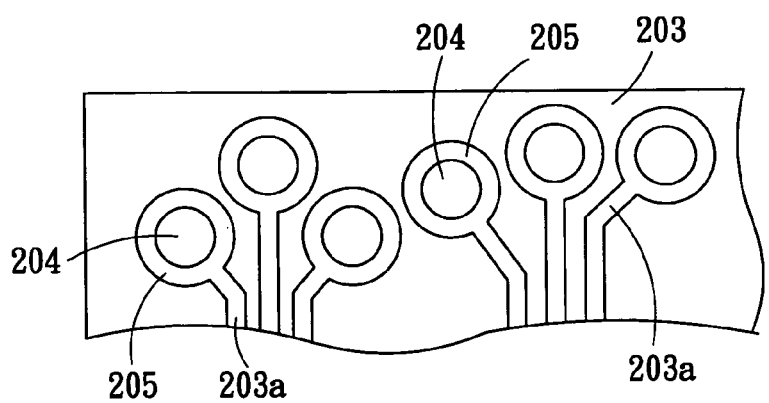
FIG. 6 is a top view of an intermediate substrate according to FIG. 5.
Figure 7:
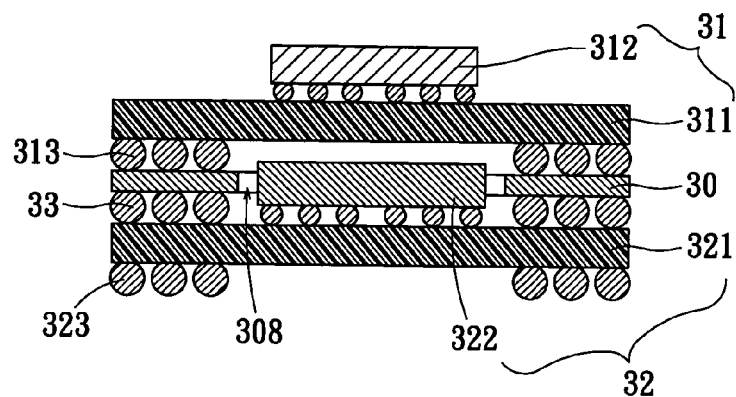
FIG. 7 is a cross-sectional view of a multi-chips module assembly package with an intermediate substrate in a stacked type according to the first embodiment of the present invention.
Figure 8:
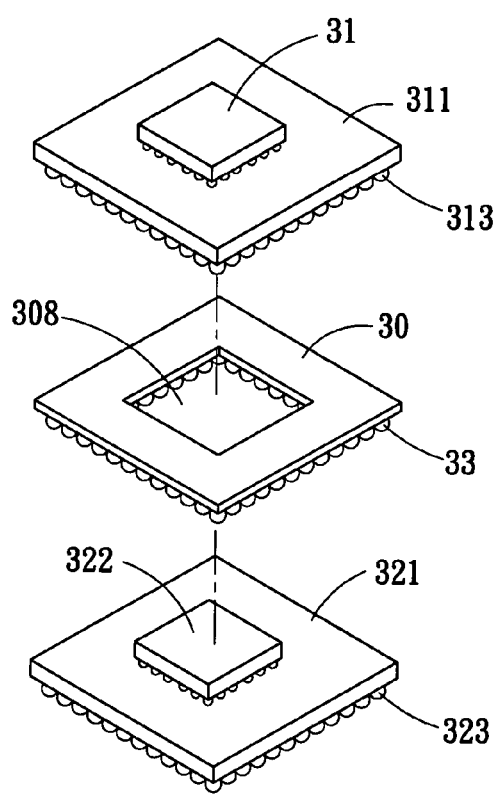
FIG. 8 is an exploded view of said multi-chips module assembly package according to FIG. 7.

It should be noted that said intermediate substrate 30 is different from the conventional substrate shown in FIG. 5 and FIG. 6 and the detailed description will be shown as following.

Figure 9:
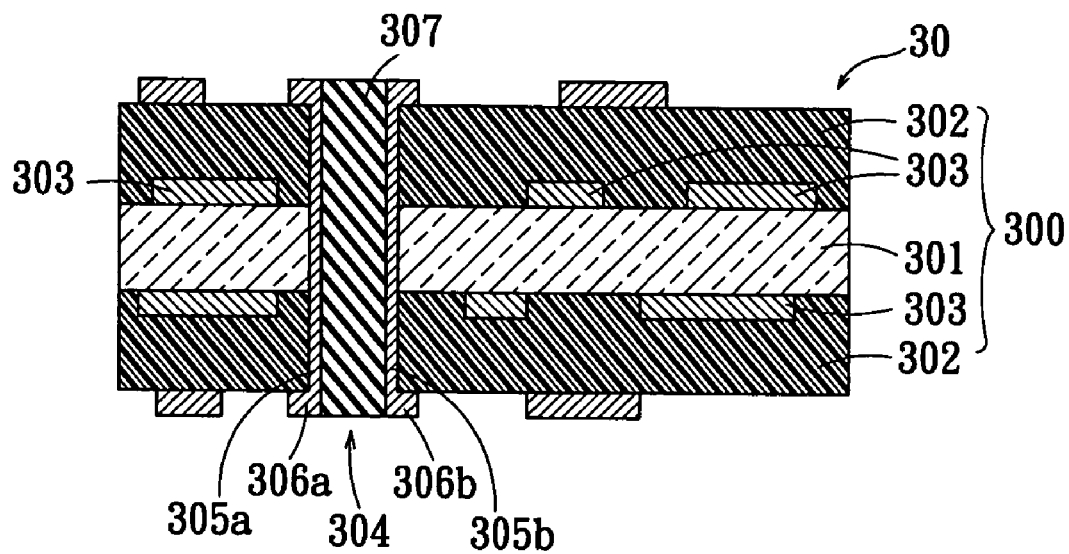
FIG. 9 is a cross-sectional view of an intermediate substrate according to FIG. 7.
Figure 10:
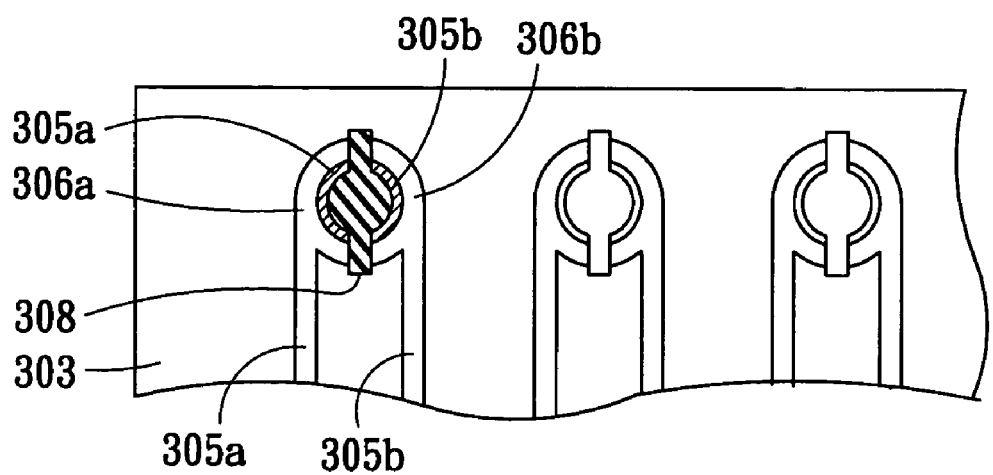
FIG. 10 is a top view of an intermediate substrate according to FIG. 9.

Referring to FIGS. 9 and 10, the intermediate substrate 30 includes a board 300, a via 304, separated electrically conductive layers 305a and 305b, and an insulator 307. The board 300 comprises a core board 301, and a plurality of insulating layers 302 and circuit layers 303 wherein the insulating layers 302 and the circuit layers 303 are interlaced with each other. The material of the insulating layers 302 can be Bismaleimide-Triazine (BT), glass epoxy resins (FR4), epoxy or polyimide. The circuit layer 303 can be formed by the steps of forming a copper foil on the surface of the insulating layer 302, forming a patterned photo-resist layer on the copper foil, removing a portion of the copper foil by etching and using photo-resist layer as a mask, and removing the photo-resist layer.

Via 304 can be formed by a mechanical method or a chemical method, and the via 304 can be a through hole, a buried via or a blind via. Separated electrically conductive layers 305a and 305b can be formed on the inner wall 304 of the via 304 by the method of electro-less plating or direct plating. Separated via lands 306a and 306b are disposed on the board 300 and at the periphery of the via 304, and the material of the separated via lands 306a and 3060b are with good electrical conductivity. Generally speaking, the material of the separated via lands 306a and 306b is substantially the same as the circuit traces 303a and 303b, for example copper metal. The via 304 is filled with an insulator 307 which separates the via 304 into a plurality of separated vias (not shown) so as to separate the electrically conductive layer on the inner wall of the via into a plurality of separated electrically conductive layers, and then the separated electrically conductive layers 305a and 305b are electrically isolated from each other by the insulator 307. In addition, the separated via lands 306a and 306b are also electrically isolated from each other. The insulator 307 can be made of insulating materials, for example epoxy resin and ink. Besides, the separated electrically conductive layers 305a and 305b are electrically connected with the circuit traces 303a and 303b through the separated via lands 306a and 306b.

As mentioned above, the via 304 is entirely filled with an insulator 307, for example epoxy resin and ink. In such manner, the separated electrically conductive layers 305a and 305b disposed on the inner wall of the via 304 can be electrically isolated from each other and electrically connected to the circuit traces 303a and 303b respectively. Namely, each via has at least two independently electrical paths. Thus, the number of the electrical paths will be increased without increasing the number of the vias. Accordingly, the area for laying out the vias will be reduced so as to increase the density of circuit traces in the intermediate substrate and dispose more conductive devices at the periphery of the first substrate and the second substrate. In addition, the bent portions of the circuit traces will be reduced so as to shorten the electrical paths.

Figure 11:
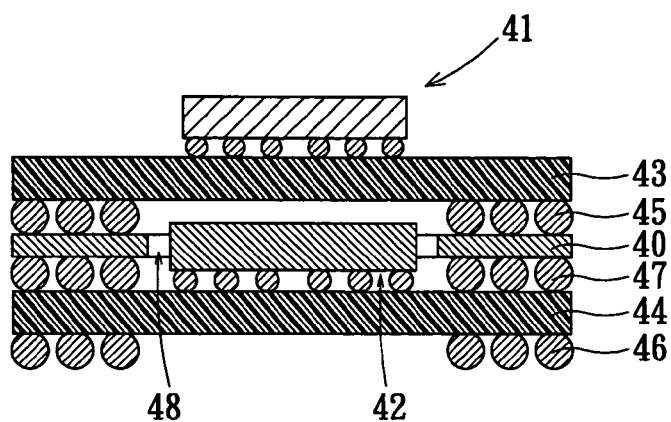
FIG. 11 is a cross-sectional view of a multi-chips module assembly package with an intermediate substrate in a stacked type according to the second embodiment of the present invention.
Figure 12:
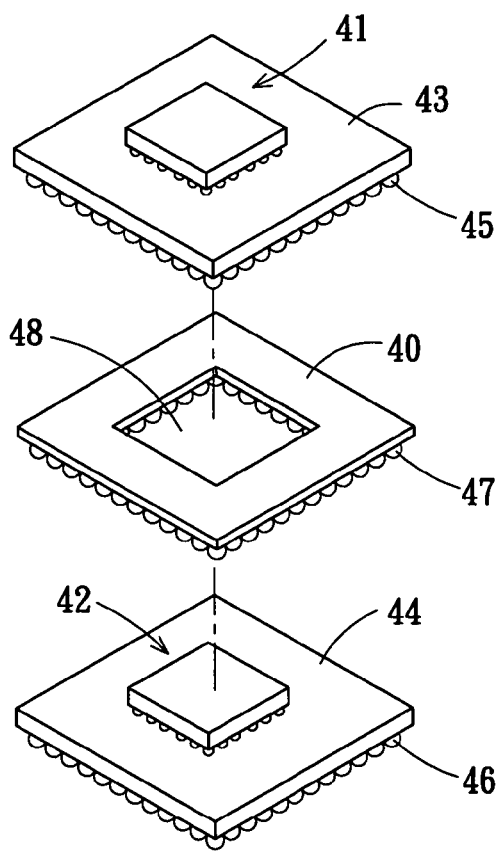
FIG. 12 is an exploded view of said multi-chips module assembly package according to FIG. 11.

Next, referring to FIG. 11 and FIG. 12, a second preferred embodiment is provided. The multi-chips module assembly package mainly comprises an intermediate substrate 40, a first package 41, a second package 42, a first carrier 43 and a second carrier 44. Therein, the first package 41 can be a ball grid array package (BGA), for example a flip chip BGA and a plastic BGA, or a leadless package, for example a bump-chip-carrier package (BCC) and a quad-flat-no lead package (QFN). Similarly, the second package 42 can also be a ball grid array package or a leadless package. Said first package 41 and said second package 42 are electrically connected to the first carrier 43 and the second carrier 44 respectively. Furthermore, a first conductive device 45 is formed on the lower surface of the first carrier 43 for electrically connecting to the intermediate substrate 40 and a third conductive device 47 is provided on the lower surface of the intermediate substrate 40 so as to electrically connect to the second package 42. Moreover, a second conductive device 46 also can be provided on the lower surface of the second carrier 44 so that the signals can be transmitted from the first package 41 and the second package 42 to external devices through the intermediate substrate 40, the first carrier 43 and the second carrier 44.

It should be noted that the intermediate substrate 40 is the same as the intermediate substrate 30 specified in the first embodiment as shown in FIG. 9 and FIG. 10. The electrically conductive layer on the inner wall of the via in the intermediate substrate is separated into several separated electrically conductive layers by disposing insulator in the via, so each of separated electrically conductive layers can be electrically isolated from each other and treated as an independently electrical path. Thus, the number of the electrical paths will be increased without increasing the number of the vias. Accordingly, the area for laying out the vias will be reduced so as to increase the density of circuit traces in the intermediate substrate and dispose more conductive devices at the periphery of the first carrier and the second carrier. In addition, the bent portions of the circuit traces will be reduced so as to shorten the electrical paths.

Although the invention has been described in considerable detail with reference to certain preferred embodiments, it will be appreciated and understood that various changes and modifications may be made without departing from the spirit and scope of the invention as defined in the appended claims.

What is claimed is:

1. A multi-chips module assembly package, comprising:
    a first package;
    an intermediate substrate having an opening, a via and a plurality of circuit layers, wherein a plurality of separated electrically conductive layers are formed on an inner wall of the via, an insulator is formed in the via and disposed between the separated electrically conductive layers, and the separated electrically conductive layers are electrically connected to the corresponding circuit layers respectively, wherein the insulator electrically isolates from each of the electrically conductive layer; and
    a second package electrically connected to the first package through the separated electrically conductive layers and the circuit layers.

2. The multi-chips module assembly package of claim 1, further comprising:
    a first conductive device formed on the lower surface of the first package;
    a second conductive device formed on the lower surface of the second package; and
    a third conductive device formed on the lower surface of the Intermediate substrate, wherein the first conductive device connects the first package and the intermediate substrate, and the third conductive device connects the second package and the intermediate substrate.

3. The multi-chips module assembly package of claim 2, wherein the first conductive device is electrically connected to the third conductive device through one of the separated electrically conductive layers and one of the circuit layers.

4. The multi-chips module assembly package of claim 1, wherein the intermediate substrate further comprises a plurality of separated via lands disposed at the periphery of the via.

5. The multi-chips module assembly package of claim 4, wherein each of the separated via lands is disposed correspondingly to each of the separated electrically conductive layers.

6. The multi-chips module assembly package of claim 1, wherein the insulator is positioned between the separated electrically conductive layers.

7. The multi-chips module assembly package of claim 1, wherein the via is a through hole.

8. The multi-chips module assembly package of claim 1, wherein the material of the separated electrically conductive layers is copper.

9. The multi-chips module assembly package of claim 1, wherein the material of the insulator is epoxy.

10. The multi-chips module assembly package of claim 1, wherein the material of the insulator is ink.

11. The multi-chips module assembly package of claim 1, wherein the first conductive device is a solder ball.

12. The multi-chips module assembly package of claim 1, wherein the first package comprises a first chip and a first substrate.

13. The multi-chips module assembly package of claim 12, wherein the first chip is flip-chip bonded to the first substrate.

14. The multi-chips module assembly package of claim 12, wherein the first chip is wire-bonded to the first substrate.

15. The multi-chips module assembly package of claim 1, wherein the second package comprises a second chip and a second substrate, and the second chip is disposed in the opening.

16. A multi-chips module assembly package, comprising:
a first carrier;
a first package disposed on the first carrier and electrically connected to the first carrier;
an intermediate substrate having a via and a plurality of circuit layers, wherein a plurality of separated electrically conductive layers are formed on an inner wall of the via, an insulator is formed in the via and disposed between the separated electrically conductive layers, and the separated electrically conductive layers are electrically connected to the corresponding conductive traces layer respectively, wherein the insulator electrically isolates from each of the electrically conductive layer;
a second carrier; and
a second package disposed on the second carrier and electrically connected to the second carrier, the second package electrically connected to the first package through the separated electrically conductive layers and the circuit layers.

17. The multi-chips module assembly package of claim 16, wherein the intermediate substrate further comprises an opening, and the second package is disposed in the opening.

18. The multi-chips module assembly package of claim 16, further comprising:
a first conductive device formed on the lower surface of the first carrier;
a second conductive device formed on the lower surface of the second carrier; and
a third conductive device formed on the lower surface of the intermediate substrate, wherein the first conductive device connects the first carrier and the intermediate substrate, and the third conductive device connects the second carrier and the intermediate substrate.

19. The multi-chips module assembly package of claim 18, wherein the first conductive device is electrically connected to the third conductive device through one of the separated electrically conductive layers and one of the circuit layers.

20. The multi-chips module assembly package of claim 16, wherein the first package is a flip-chip package.

21. The multi-chips module assembly package of claim 16, wherein the first package is a leadless package.

* * * * *